United States Patent [19]
Shirai

[11] Patent Number: 6,140,835
[45] Date of Patent: *Oct. 31, 2000

[54] INPUT BUFFER CIRCUIT

[75] Inventor: Takayuki Shirai, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/703,376

[22] Filed: Aug. 26, 1996

[30] Foreign Application Priority Data

Aug. 30, 1995 [JP] Japan ................................. 7-222385

[51] Int. Cl.$^7$ .............................................. H03K 19/0185
[52] U.S. Cl. ............................... 326/24; 326/34; 326/83; 327/206
[58] Field of Search ........................... 326/22–24, 26–27, 326/33–34, 83, 86–87, 121; 327/205–206, 68, 74, 76

[56] References Cited

U.S. PATENT DOCUMENTS

| | | | |
|---|---|---|---|
| 3,904,888 | 9/1975 | Griffin et al. | 326/24 |
| 4,570,091 | 2/1986 | Yasuda et al. | 326/87 |
| 5,336,942 | 8/1994 | Khayat | 327/206 |
| 5,341,033 | 8/1994 | Koker | 327/206 |
| 5,654,645 | 8/1997 | Lotfi | 326/24 |

FOREIGN PATENT DOCUMENTS

| | | |
|---|---|---|
| 4-100411 | 4/1992 | Japan . |
| WO 86/07220 | 12/1986 | WIPO . |

OTHER PUBLICATIONS

Patent Abstracts of Japan, vol. 016, No. 415, Sep. 2, 1992 (JP–A–04 139870).
Patent Abstracts of Japan, vol. 016, No. 336, Jul. 21, 1992 (JP–A–04 100411).

*Primary Examiner*—Jon Santamauro
*Attorney, Agent, or Firm*—Sughrue, Mion, Zinn, Macpeak & Seas, PLLC

[57] ABSTRACT

The present invention is directed to an input buffer circuit comprising a first inverter for receiving an input signal, a second inverter for receiving an output signal from the first inverter, and a transition time detecting circuit for detecting a transition time of an output signal of a sense amplifier which amplifies and reads a logic value stored in a memory cell. The transition time detecting circuit generates a control signal for a delay depending on a detected level of the transition time. A logic threshold control circuit is provided for feeding the control signal from the transition time detecting means back to an input terminal of said second inverter to control a hysteresis interval of a logic threshold level of an output signal produced in response to the input signal. An output signal from the second inverter is delayed by a delay circuit which provides the delayed output signal to the logic threshold control circuit.

5 Claims, 9 Drawing Sheets

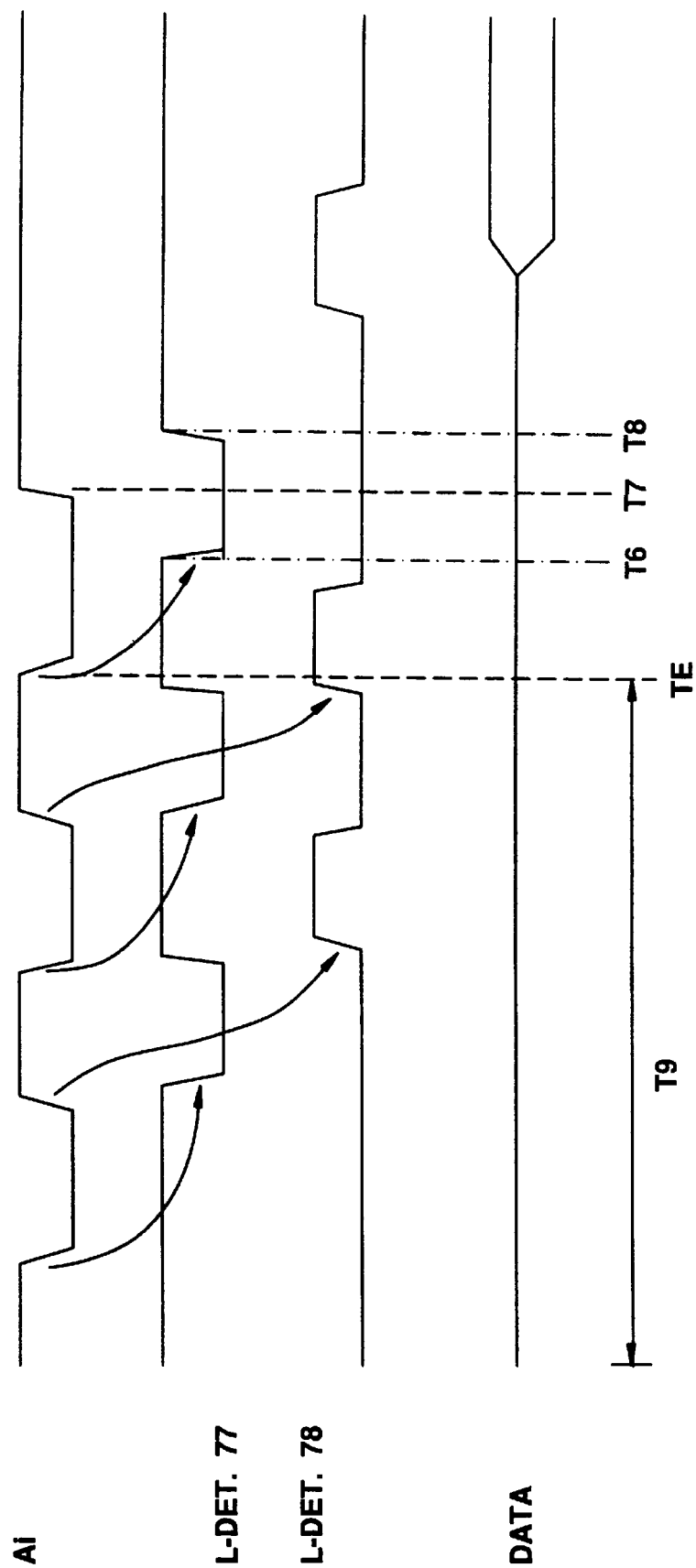

FIG.11

| DETECTOR | | | | No. OF ACTIVE BIT | | | |
|---|---|---|---|---|---|---|---|
| 24 | 23 | 22 | 21 | 1/4 bit | 2/4 bit | 3/4 bit | 4/4 bit |
| H | H | H | H | | | | |
| H | H | H | ⊔ | * | | | |
| H | H | ⊔ | H | * | | | |
| H | H | ⊔ | ⊔ | * | * | | |
| H | ⊔ | H | H | * | | | |
| H | ⊔ | H | ⊔ | * | * | | |
| H | ⊔ | ⊔ | H | * | * | | |
| H | ⊔ | ⊔ | ⊔ | * | * | * | |
| ⊔ | H | H | H | * | | | |
| ⊔ | H | H | ⊔ | * | * | | |
| ⊔ | H | ⊔ | H | * | * | | |
| ⊔ | H | ⊔ | ⊔ | * | * | * | |
| ⊔ | ⊔ | H | H | * | * | | |
| ⊔ | ⊔ | H | ⊔ | * | * | * | |
| ⊔ | ⊔ | ⊔ | H | * | * | * | |
| ⊔ | ⊔ | ⊔ | ⊔ | * | * | * | * |

INPUT BUFFER CIRCUIT

BACKGROUND OF THE INVENTION

1. Field of the Invention

The present invention relates to an input buffer circuit for use as a first-stage input circuit of a semiconductor integrated circuit device comprising a digital logic circuit or an interface between digital logic circuits.

2. Description of the Related Art

Input buffer circuits of the type described above are required to be of a high input impedance and a low output impedance, and also to be capable of outputting an input logic level at an accurate and stable level. It is also necessary for such input buffer circuits to keep a suitable noise margin so that they will not reverse the logic level in error due to noise in a power supply line.

Such a logic level reversal is caused for the following reasons:

A constant-voltage power supply line for supplying a constant bias voltage to an input buffer circuit is not dedicated to the input buffer circuit, but is shared by other logic circuits. The constant bias voltage is supplied from the constant-voltage power supply line through metallic layers, leads, and interconnections on a semiconductor substrate. Those metallic layers, leads, and interconnections have their equivalent resistance, equivalent inductance, etc., which cannot be removed. Therefore, even though a constant-voltage power supply produces an ideally constant voltage at its output terminal, the voltage on the power supply line tends to be varied by a relatively large consumed current when the logic circuits reverse the logic level, i.e., when the logic level undergoes a transition. The variation in the voltage causes the logic circuits to affect each other through current lines, resulting in an erroneous logic level reversal in a certain logic circuit. Particularly, those logic circuits which are involved in outputting data consume a relatively large current upon a logic level transition, and they bring about a logic level transition substantially simultaneously. Therefore, the voltage on the power supply line suffers a very large variation, which causes a power supply voltage lower than an inputted logic level to be instantaneously applied to an input buffer circuit in a certain location that in turn develops an erroneous logic level reversal.

Such an erroneous logic level reversal also often happens when a logic level is inputted to an input buffer circuit and thereafter a logic circuit of a stage next to the input buffer circuit undergoes a logic level transition, which produces a large change in the voltage on the power supply line that is fed back to the input buffer circuit.

For providing a noise margin to prevent the erroneous logic level reversal, it is necessary to give the input buffer circuit appropriate hysteresis characteristics as known in the art.

Hereinafter, a logic level reversal operation of an input buffer circuit will be referred to as a "first transition", and a substantially simultaneous logic reversal operation of other logic circuits than the input buffer circuits, e.g., logic circuits for outputting data or logic circuits at a stage next to the input buffer circuit, will be referred to as a "second transition".

The input buffer circuit requires no hysteresis characteristics as mentioned above in order to accurately capture an input logic level at the time of the first transition. However, the input buffer circuit should be provided with a comparatively large hysteresis interval, i.e., a shift quantity, in order to prevent itself from suffering an erroneous logic level reversal at the time of the second transition.

One conventional input buffer circuit as disclosed in Japanese laid-open patent publication No. 4-100411 will be described below with reference to FIG. 1 of the accompanying drawings.

As shown in FIG. 1, an input buffer circuit comprises a CMOS (complementary metal-oxide-semiconductor) inverter comprising a P-channel FET (field-effect transistor) P1 and an N-channel FET N1, an array of P-channel FETs P3, P2 and N-channel FETs N2, N3 connected in series between a power supply terminal 71 and a ground terminal 72, for receiving an output signal from the CMOS inverter, an inverter 73 for receiving a signal from a junction between the FETs P1, N1 and a junction between the FETs P2, N2 and outputting an inverted signal as an output signal Ao to an output terminal 75, a delay circuit 76 for receiving and delaying a signal from the output terminal 75, and a low-transition detecting circuit 77 and a high-transition detecting circuit 78 for receiving an output signal from the delay circuit 76 and outputting respective signals to the respective gates of the FETs P3, N3.

An input terminal 74 is connected to the gates of the FETs P1, P2, N1, N2. The FETs P1, N1 have respective power supply terminals connected commonly to the power supply terminal 71 and the ground terminal 72 of the FETs P3, P2, N2, N3.

FIG. 2 of the accompanying drawings shows a timing chart illustrative of operation of the input buffer circuit shown in FIG. 1. If an input signal Ai supplied from the input terminal 74 comprises a negative pulse, then an output waveform from the delay circuit 76 is outputted with a time delay of td2 from the input signal Ai. The low-transition detecting circuit 77 outputs a low level for a certain period of time from a time T2 immediately after the output waveform from the delay circuit 76 shifts from a high level to a low level to a time T3. In response to the low level outputted from the low-transition detecting circuit 77, the FET P3 is rendered conductive. Since the FETs P1, P2 are conductive and the FET N3 is nonconductive, a logic threshold VthH for the input signal Ai is high, increasing a margin for keeping the low level of the input buffer circuit.

For a period of time from a time T4 to a time T5, during which an output signal from the high-transition detecting circuit 78 is of a high level due to an output signal from the delay circuit 76, the FETs N3, N1, N2 are rendered conductive and the FET P3 is rendered nonconductive, lowering a logic threshold VthL for the input signal Ai. Therefore, the input buffer circuit has a large margin for keeping the high level.

FIG. 3 of the accompanying drawings shows the relationship between the logic threshold VthL and the logic threshold VthH. In FIG. 3, the horizontal axis represents the voltage (V) of the input signal Ai, and the vertical axis represents the input voltage (V) applied to the inverter 73, i.e., an inverted value of the output signal Ao. A threshold VthM intermediate between the low and high thresholds VthL, VthH prevails when both the FETs P3, N3 are nonconductive over a period of time between the times T3, T4 shown in FIG. 2.

The periods of time between the times T2, T3 and between the times T4, T5 are a transition period for outputting data from the logic system of the input buffer circuit, i.e., a second transition period. The delay time of the delay circuit 76 is adjusted to cover the second transition period.

The above publication does not disclose any circuit arrangement of the low-transition detecting circuit 77 and the high-transition detecting circuit 78. One example of these circuits 77, 78 will be described below with reference to FIGS. 4(A) and 4(B) of the accompanying drawings.

As shown in FIG. 4(A), the low-transition detecting circuit comprises a NOR gate for being supplied with an input signal and a signal produced by processing the input signal with an opposite-phase delay element, and an inverter for being supplied with an output signal from the NOR gate. The low-transition detecting circuit of this arrangement outputs a logic level 0 only when two input signals applied to the NOR gate are of a level 0.

As shown in FIG. 4(B), the high-transition detecting circuit is similar to the low-transition detecting circuit shown in FIG. 4(A) except that a NAND gate is connected in place of the NOR gate shown in FIG. 4(A). The high-transition detecting circuit of this arrangement outputs a logic level 1 only when two input signals applied to the NAND gate are of a level 1.

The opposite-phase delay element shifts the input signal into opposite phase, i.e., produces an inverted value of the input signal, and delays the same.

With the conventional input buffer circuit shown in FIG. 1, the delay time td2 of the delay circuit 76 is adjusted to shift the logic thresholds into alignment with the second transition period for thereby preventing the input buffer circuit from operating in error upon a data output transition when power supply noise is most likely to occur.

Input signals applied to the input buffer circuit are not limited to the input signal Ai shown in FIG. 2. The input buffer circuit may be supplied with an input waveform in which a dummy cycle is present as shown in FIG. 5 of the accompanying drawings. The dummy cycle is a period of time in which only addresses are idly cycled in a standby condition of a system which uses integrated circuits (ICs).

In FIG. 5 when the low-transition detecting circuit 77 generates a low-level pulse between times T6 and T8 in a certain period of time from a time TE at which a final dummy waveform is inputted, the logic threshold VthH is high during the period of the low-level pulse. If the input signal Ai changes from the low level to the high level during this time, the time to output high level data is delayed, and hence the outputting of the data cannot be speeded up due to the delay. In some cases, the high level data cannot be outputted.

If a logic circuit is used as a static operation system, then even when an input signal applied to an input buffer circuit undergoes several transitions, a delay time from the final transition to the outputting of final data has to fall within a predetermined range, also posing the problem of a speed delay.

Moreover, a transition of the output of data may not necessarily occur after elapse of the time td2 from the input signal Ai, but may occur with slight variations of time. Consequently, no accurate time matching can be achieved if the time td2 is determined on the basis of the output signal Ao. Rather, it has been found out that it is more accurate to directly detect and use the time of a transition of an output driver or the like.

The conventional input buffer circuit is further problematic in that inasmuch the above transition detecting circuits need to be added to all input buffer circuits, but no common transition detecting circuits are available which would otherwise be shared by all input buffer circuits, the number of constituent elements increases, imposing a limitation on efforts to reduce the chip size.

SUMMARY OF THE INVENTION

It is therefore an object of the present invention to provide an input buffer circuit which is capable of maintaining a high noise margin and accurately outputting an inputted logic level even if a dummy cycle is present in an input signal.

Another object of the present invention is to provide an input buffer circuit which will determine a second transition time at which most power supply line noise is generated, based on an output signal from a sense amplifier.

Still another object of the present invention is to provide an input buffer circuit which has a hysteresis interval automatically variable depending on the level of generated power supply line noise if a noise margin is to be kept depending on the level of generated power supply line noise.

Yet still another object of the present invention is to provide an input buffer circuit which is designed such that transition detecting circuits are not required to be added individually to all input buffer circuits.

A further object of the present invention is to provide an input buffer circuit which has a reduced number of constituent elements thereby to keep its chip size from increasing.

A yet further object of the present invention is to provide an input buffer circuit which prevents an output signal from being delayed due to the occurrence of an inverse noise margin.

To achieve the above objects, there is provided in accordance with the present invention 1. An input buffer circuit comprising a first inverter for receiving an input signal, a second inverter for receiving an output signal from the first inverter, a transition time detecting circuit for detecting a transition time of a final output signal and outputting a control signal for a delay depending on a detected level of the transition time, a logic threshold control circuit for feeding the control signal from the transition time detecting circuit back to an input terminal of the second inverter to control a shift quantity of a logic threshold of an output signal produced in response to the input signal, and a delay circuit for delaying an output signal from the second inverter and inputting the delayed output signal to the logic threshold control circuit.

With this arrangement, it is possible to control the logic threshold based on large power supply line noise which is detected based on the final output signal.

The transition time detecting circuit may comprise a plurality of transition time detecting circuits for detecting a transition time of a final output signal with a plurality of transition bits and outputting a plurality of respective control signals, and the logic threshold control circuit may comprise means for varying the shift quantity of the logic threshold of the output signal produced in response to the input signal, with the control signals outputted by the transition time detecting circuit.

The shift quantity of the logic threshold is automatically controlled depending on the number of transition bits outputted from the transition time detecting circuit for preventing the input buffer circuit from operating in error due to large power supply line noise and also avoiding an operation delay caused by an excessive shift of the logic threshold due to small power supply line noise. It is also possible to control the shift quantity of the logic threshold of the output signal produced in response to the input signal at the time maximum power supply line noise is generated.

The above and other objects, features, and advantages of the present invention will become apparent from the following description referring to the accompanying drawings which illustrate examples of preferred embodiments of the present invention.

BRIEF DESCRIPTION OF THE DRAWINGS

FIG. 5 is a timing chart illustrative of operation of the conventional input buffer circuit shown in FIG. 1 at the time a dummy cycle is present in an input waveform;

FIG. 11 is a timing chart illustrative of operation of the input buffer circuit shown in FIG. 9.

DETAILED DESCRIPTION OF THE PREFERRED EMBODIMENTS

Figure 6:
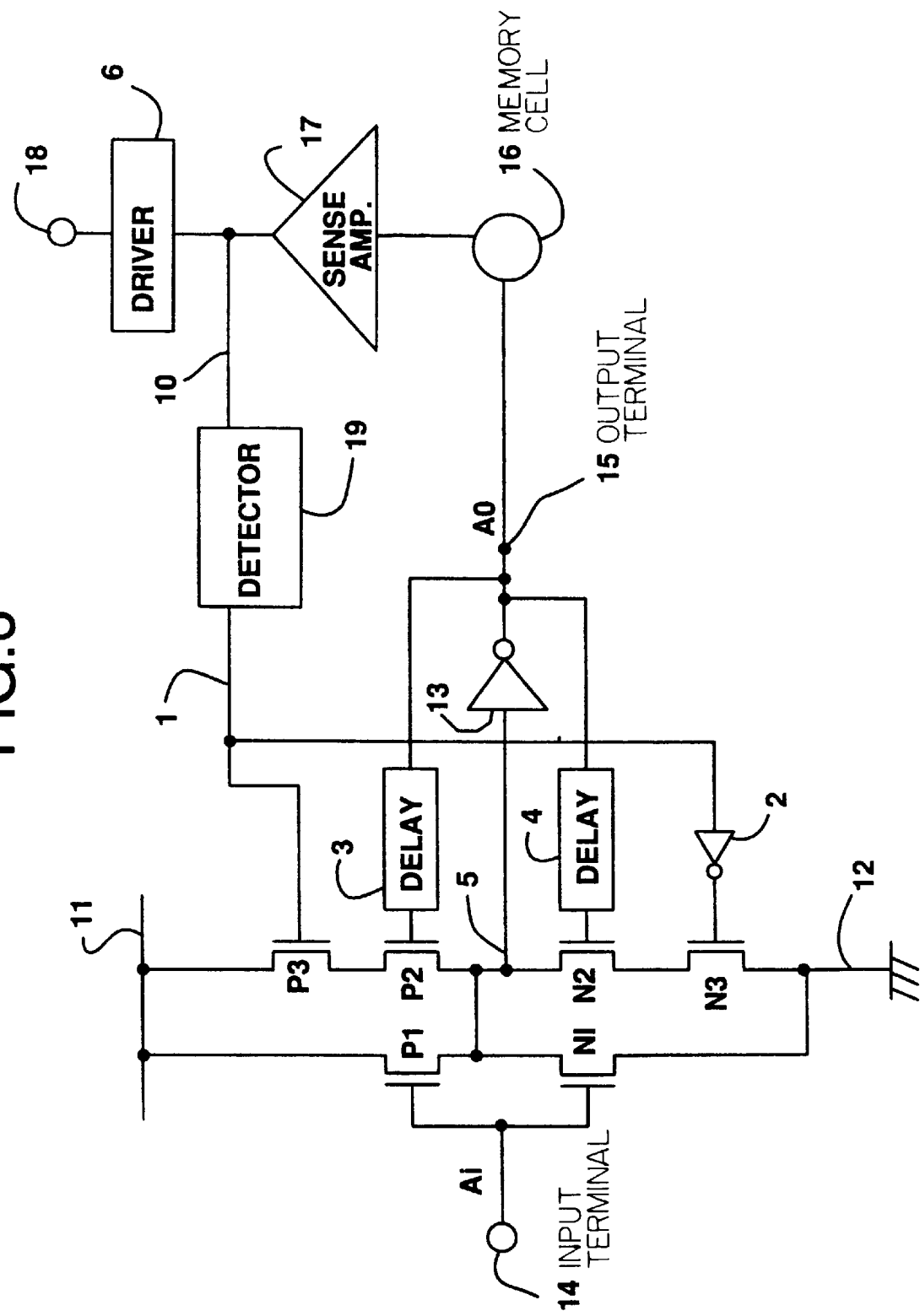
FIG. 6 is a block diagram of an input buffer circuit according to a first embodiment of the present invention.

As shown in FIG. 6, an input buffer circuit according to a first embodiment of the present invention comprises an input terminal 14 to which an input signal Ai is applied, a CMOS inverter comprising a P-channel FET P1 and an N-channel FET N1 which are connected between a power supply terminal 11 and a ground terminal 12, a logic threshold control circuit comprising P-channel FETs P3, P2 and N-channel FETs N2, N3 which are connected in series between the power supply terminal 11 and the ground terminal 12, a first-stage output terminal 5 connected commonly to a junction between the FETs P1, N1 and a junction between the FETs P2, N2, an inverter 13 for inverting an input signal from the first-stage output terminal 5 and outputting an output signal Ao to an output terminal 15, a pair of delay circuits 3, 4 for receiving an output signal from the inverter 13 and outputting a delayed signal to the gates of the FETs P2, N2, a final output transition time detecting circuit 19 for detecting a final output transition time from an output signal (SA output signal) 10 from a sense amplifier 17 which amplifies and reads a logic value stored in a memory cell 16, and an inverter 2 for receiving an output signal 1 from the final output transition time detecting circuit 19 and outputting an inverted signal to the gate of the FET N3. The input buffer circuit is fabricated on a 1-chip semiconductor substrate.

The input terminal 14 is connected to the gates of the FETs P1, N1. The output signal from the final output transition time detecting circuit 19 is applied to the gate of the FET P3 as well as the gate of the FET N3 through the inverter 2.

Figure 7:
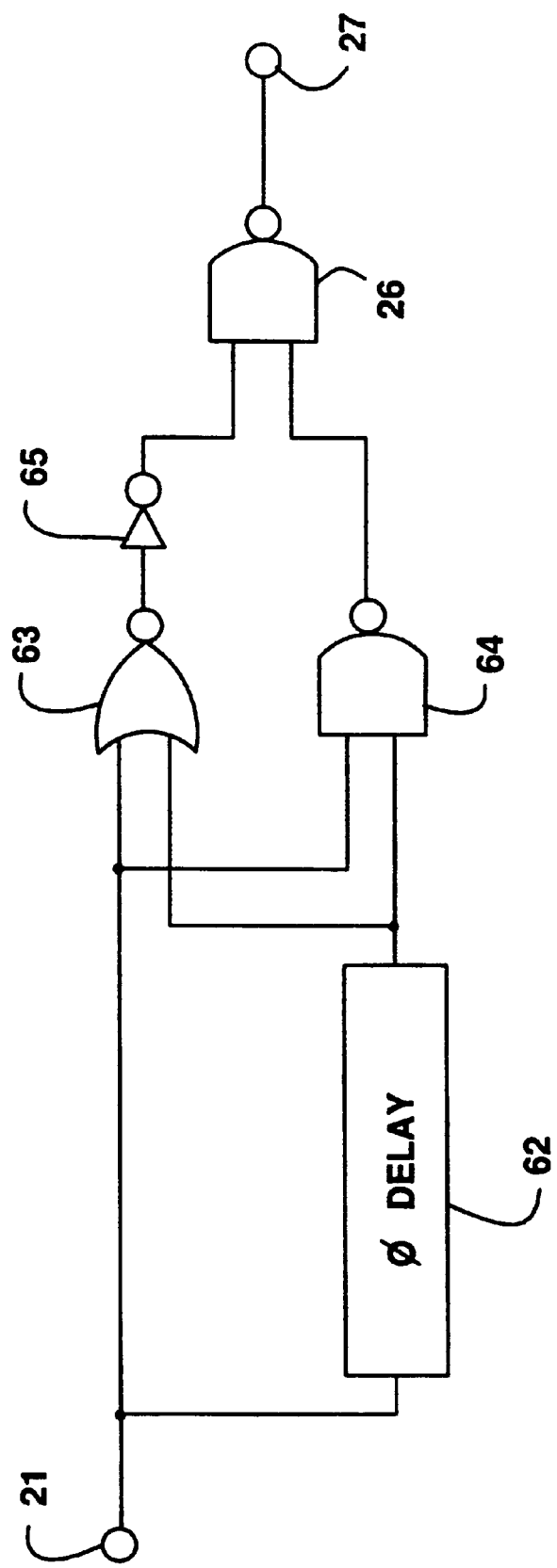
FIG. 7 is a block diagram of a final output transition detecting circuit of the input buffer circuit shown in FIG. 6.

The final output transition time detecting circuit 19 is shown by way of example in FIG. 7. As shown in FIG. 7, the final output transition time detecting circuit 19 comprises an SA input terminal 21 for receiving the SA output signal 10, an in-phase delay circuit 62 for delaying the SA output signal supplied from the SA input terminal 21, a NOR gate 63 and a NAND gate 64 for receiving the SA output signal supplied from the SA input terminal 21 and an output signal from the in-phase delay circuit 62, an inverter 65 for receiving an output signal from the NOR gate 63, a NAND gate 26 for receiving output signals from the inverter 65 and the NAND gate 64, and an output terminal 27 for outputting an output signal from the NAND gate 26 as the output signal 1 of the final output transition time detecting circuit 19. The final output transition time detecting circuit 19 may be of the same circuit arrangement as an address transition detecting circuit which finds wide use in the art.

Each of the delay circuits 3, 4 shown in FIG. 6 comprises a series-connected circuit of a resistor and a capacitor, and inverters in an even number of stages, and functions as a low-pass filter for cutting off short pulse signals.

Figure 8:
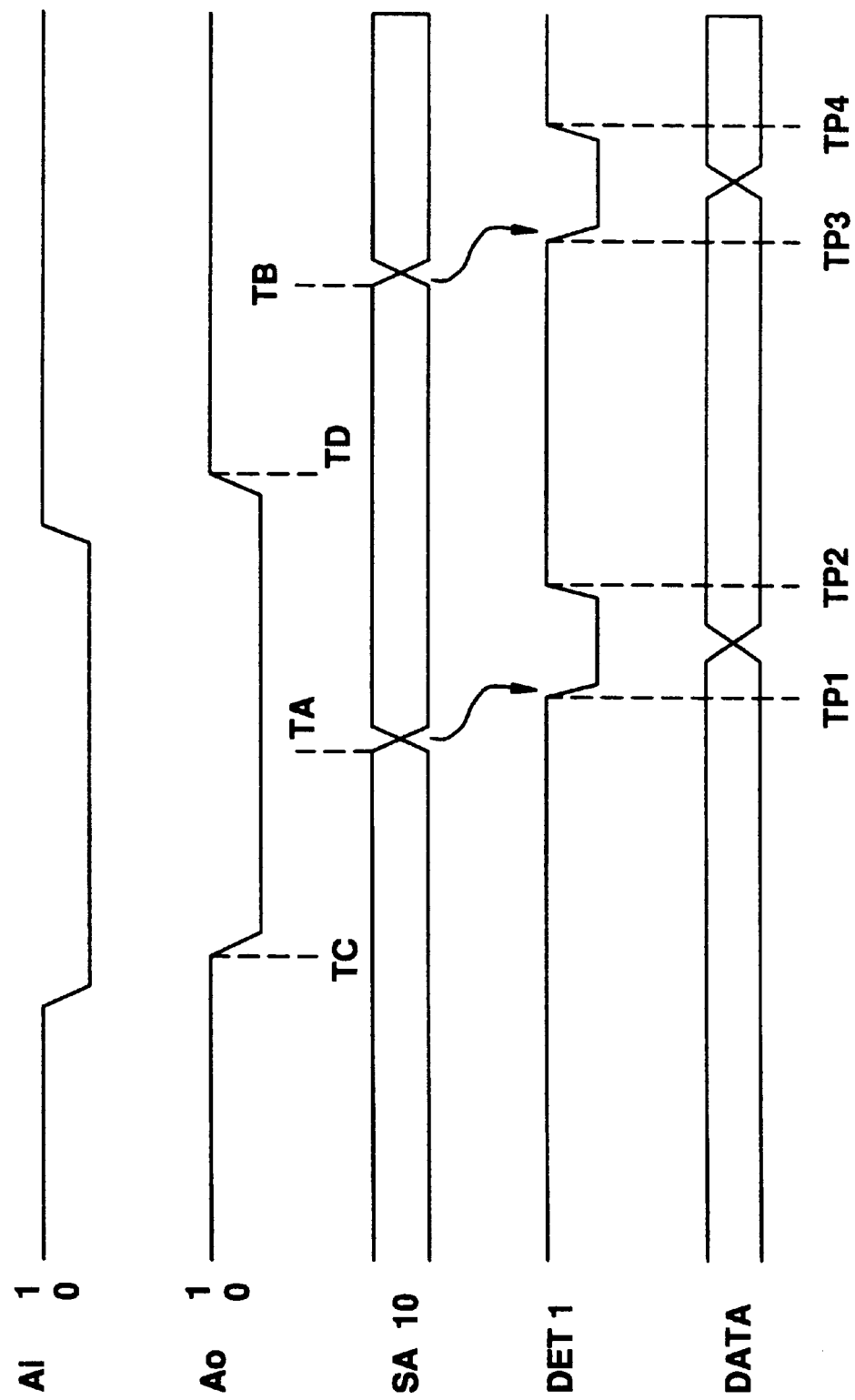
FIG. 8 is a timing chart illustrative of operation of the input buffer circuit shown in FIG. 6.

Operation of the input buffer circuit shown in FIG. 6 will be described below with reference to a timing chart shown in FIG. 8.

When the input signal Ai changes from a high level of logic value "1" to a low level of logic value "0", the output terminal 15 connected to the inverter 13 outputs an output signal Ao which slightly lags the input signal Ai in phase. The output signal Ao is further delayed by the delay circuits 3, 4, bringing the voltage applied to the gates of the FETs P2, N2 from a high level to a low level. During a period from a time TC to a time TA, the delay circuits 3, 4 are effective as a low-pass filter.

When the FETs P1, P2 are rendered conductive and the final output transition time detecting circuit 19 detects a transition, the final output transition time detecting circuit 19 outputs a low pulse as its output signal 1 between a time TP1 and a time TP2, and applies the low pulse to the gate of the FET P3. The FET P3 is now rendered conductive, whereupon the threshold of the input first stage changes to a high logic threshold VthH as shown in FIG. 3.

Figure 1:
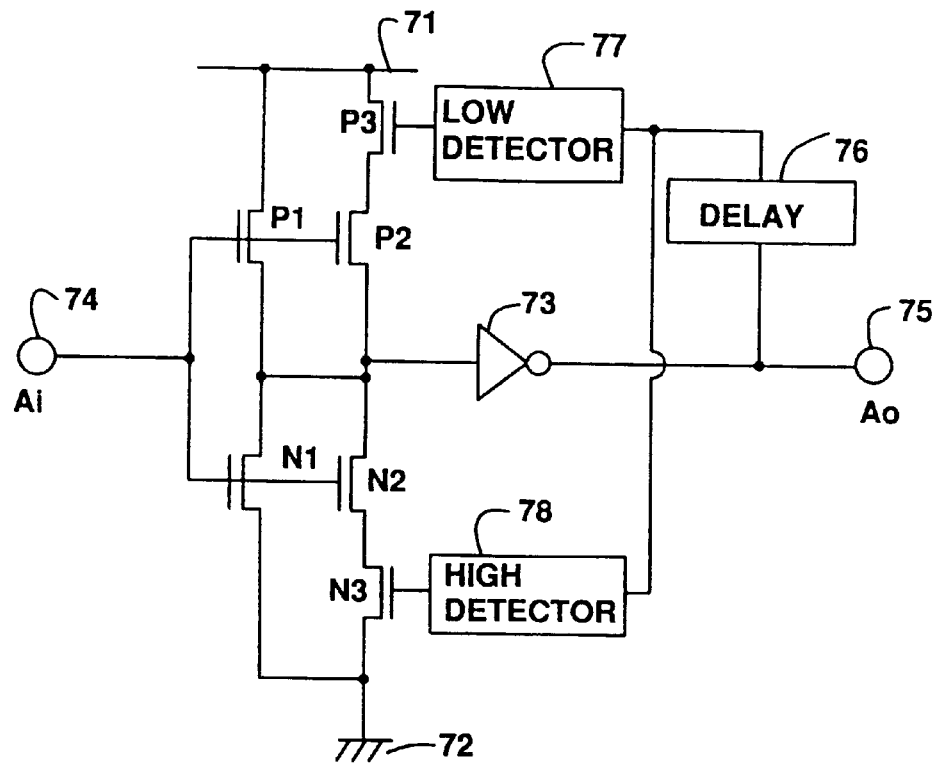
FIG. 1 is a block diagram of a conventional input buffer circuit.
Figure 2:
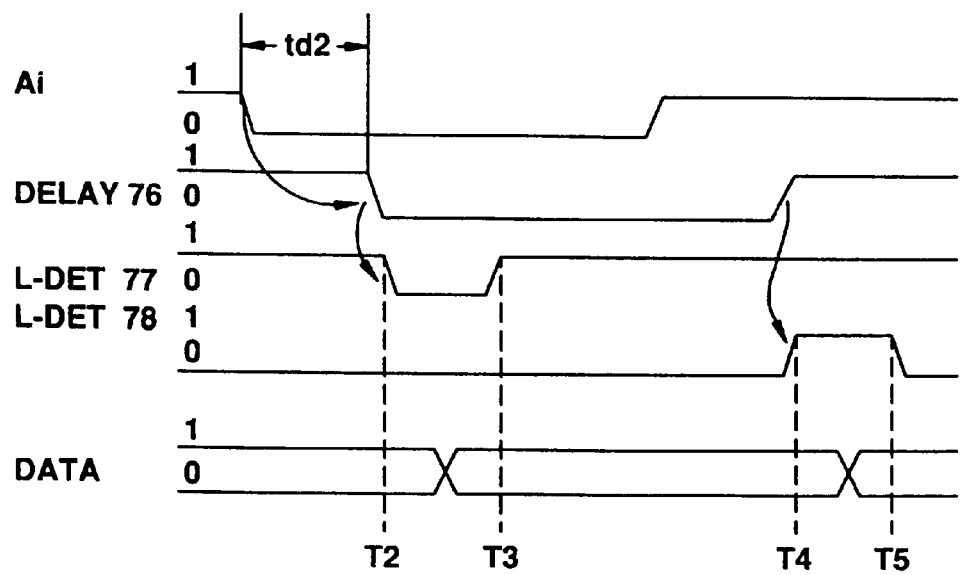
FIG. 2 is a timing chart illustrative of operation of the conventional input buffer circuit shown in FIG. 1.
Figure 3:
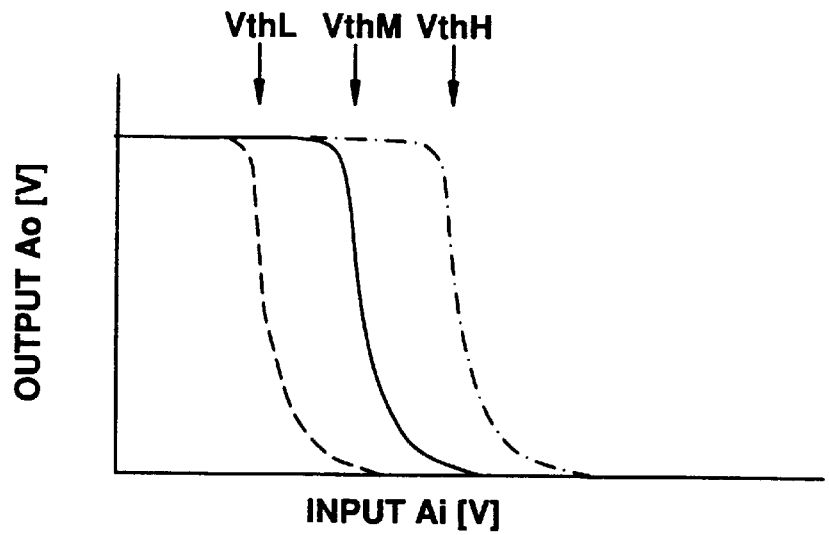
FIG. 3 is a diagram showing the input voltage vs. output voltage characteristics of the conventional input buffer circuit shown in FIG. 1.
Figure 4A:
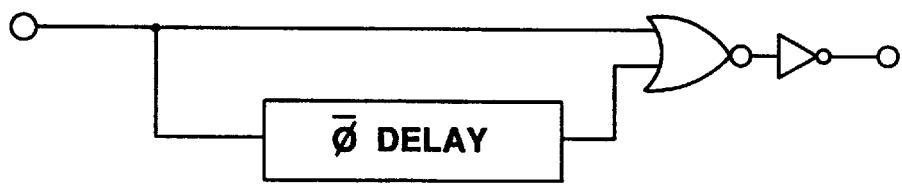
FIG. 4(A) is a block diagram of a low-transition detecting circuit of the conventional input buffer shown in FIG. 1.
Figure 4B:
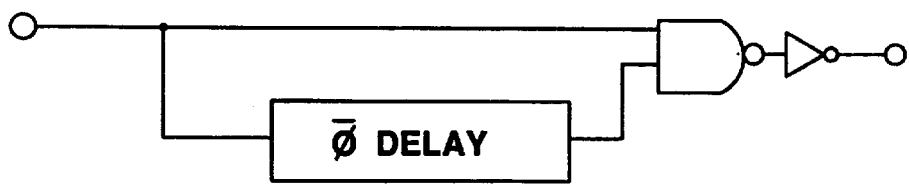
FIG. 4(B) is a block diagram of a high-transition detecting circuit of the conventional input buffer circuit shown in FIG. 1.

When the input signal Ai changes from a low level of logic value "0" to a high level of logic value "1", the FETs N1, N2, N3 are rendered conductive during a period between a time TP3 and a time TP4, causing the threshold of the input first stage to change to a low logic threshold VthL as shown in FIG. 3. The duration of the delay caused by the final output transition time detecting circuit 19, i.e., the delay circuit 64 shown in FIG. 7, is selected such that a final data output transition occurs in the period between the time TP1 and the time TP2 and the period between the time TP3 and the time TP4, with the result that the input buffer circuit can effectively operate as a hysteresis circuit.

Stated otherwise, a final data output transition time at which power supply line noise is most likely to occur can be adjusted into agreement with the above periods thereby to prevent the input buffer circuit from operating in error due to power supply line noise. Since a transition-detected pulse of a final data output signal is produced depending on the SA output signal 10 from the sense amplifier 17 which is connected immediately prior to a driver 6 of a final output circuit, the above timing adjustment may be carried out based on only trailing edges of generated pulses at the times TP2, TP4. Accordingly, it is easy to prevent the input buffer circuit from operating in error due to power supply line noise.

Figure 9:
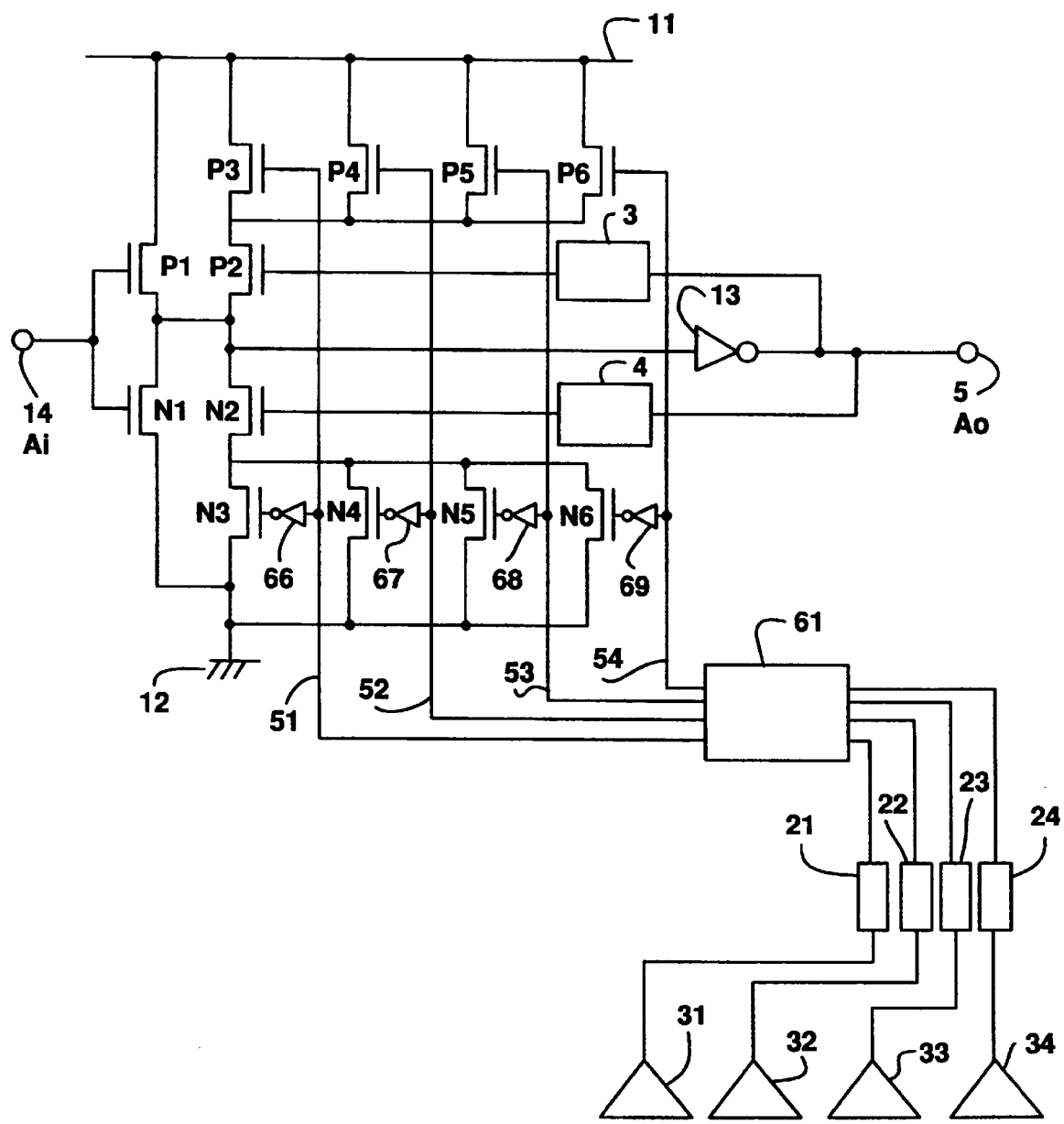
FIG. 9 is a block diagram of an input buffer circuit according to a second embodiment of the present invention.

An input buffer circuit according to a second embodiment of the present invention will be described below with reference to FIG. 9.

Those parts shown in FIG. 9 which are identical in structure and operation to those shown in FIG. 6 are denoted by identical reference numerals, and will not be described in detail below. As shown in FIG. 9, the input buffer circuit according to the second embodiment includes P-channel FETs P4, P5, P6 connected parallel to the FET P3, and N-channel FETs N4, N5, N6 connected parallel to the FET N3. An output transition bit number detecting circuit 61 applies output signals 51~54 directly to the respective gates of the FETs P3~P6, and through respective inverters 66~69 to the respective gates of the FETs N3~N6.

The sizes of the FETs P1, P2, N1, N2 on the semiconductor substrate are about four times the individual sizes of the FETs P3~P6 and N3~N6, so that they can be supplied with currents four times greater than those supplied to the FETs P3~P6 and N3~N6.

Final output transition time detecting circuits 21~24 are supplied with amplified logic levels from respective sense amplifiers 31~34, which are either high levels or low levels depending on the data stored in memory cells. The final output transition time detecting circuits 21~24 detect transitions of the supplied logic levels, and output the detected transitions to an output transition bit number detecting circuit 61. Each of the final output transition time detecting circuits 21~24 may be identical to the final output transition time detecting circuit 19 shown in FIG. 7.

Figure 10:
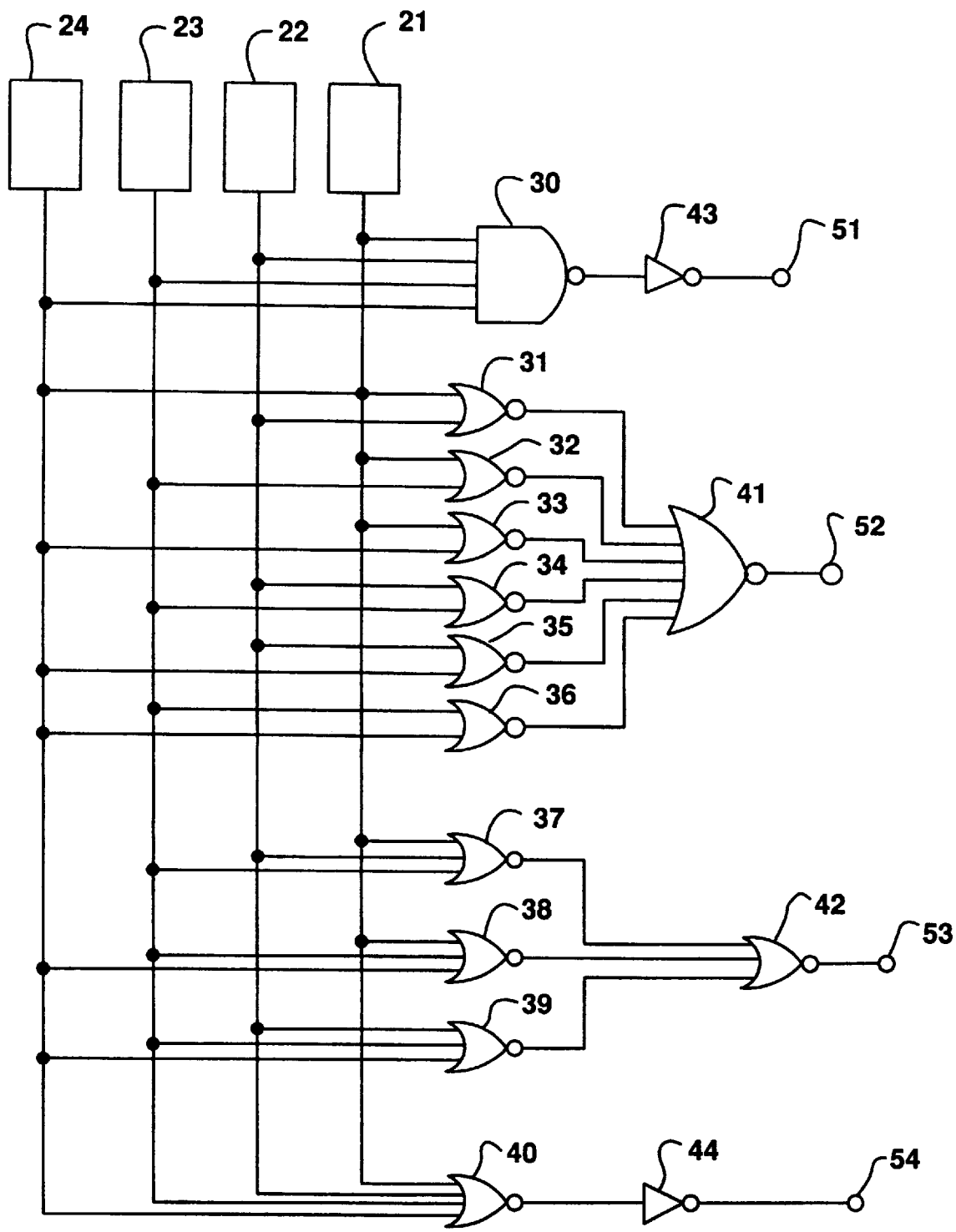
FIG. 10 is a block diagram of an output transition bit number detecting circuit of the input buffer circuit shown in FIG. 9.

The output transition bit number detecting circuit 61 converts output signals from the final output transition time detecting circuits 21~24 into 4-bit output signals 51~54, respectively. As shown in FIG. 10, the output transition bit number detecting circuit 61 comprises a four-input NAND gate 30, two-input NOR gates 31~36, three-input NOR gates 37~39, a four-input NOR gate 40, a six-input NOR gate 41 for receiving output signals from the two-input NOR gates 31~36, a three-input NOR gate 42 for receiving output signals from the three-input NOR gates 37~39, an inverter 43 for receiving an output signal from the four-input NAND gate 30, and an inverter 44 for receiving an output signal from the four-input NOR gate 40.

The logic threshold level increases to a greater degree as more of the FETs P4~P6 are rendered conductive, and the logic threshold level increases to a smaller degree as more of the FETs N4~N6 are rendered conductive, resulting in a larger shift quantity of the logic threshold. Therefore, the more the FETs are rendered conductive, the greater the hysteresis interval of the logic threshold level.

According to the second embodiment, the input buffer circuit operates as a hysteresis circuit only during a transition time of the final data output, as with the first embodiment However, the second embodiment differs from the first embodiment in that the logic threshold level of the first stage of the input buffer circuit varies depending on the number of transition output bits. Specifically, the input buffer circuit according to the second embodiment shifts the logic threshold level of the first stage in a direction for a greater margin with respect to power supply line noise which tends to increase as the number of transition bits increases.

Operation of the input buffer circuit according to the second embodiment will be described below with reference to FIG. 11.

FIG. 11 shows in its left-hand column combinations of output signals from the respective final output transition time detecting circuits 21~24 and also shows in its right-hand column the numbers of transtion bits, out of four bits, with respect to the respective combinations of the output signals in the left-hand column.

As shown in FIG. 11, the output signals from the respective final output transition time detecting circuits 21~24 are available in 16 combinations.

When the number of transition bits is 0, the FETs P3~P6 and the FETs N3~N6 are not rendered conductive, and the logic threshold level of the input first stage does not vary.

When the number of transition bits is 1 in four instances marked with * only in a column "¼ bit" shown in FIG. 11, the output transition bit number detecting circuit 61 outputs a one-shot low pulse as an output signal 51, rendering only the FETs P3, N3 conductive. An inverted level of the input first stage at the time the input signal Ai goes from the high level to the low level is determined by the FETs P1, P2, P3 and the FET N1, and an inverted level of the input first stage at the time the input signal Ai goes from the low level to the high level is determined by the FETs N1, N2, N3 and the FET P1. The one-shot low pulse is generated at the same time as with the first embodiment.

Similarly, when the number of transition bits is 2, the output transition bit number detecting circuit 61 outputs one-shot pulses as output signals 51, 52, making corresponding FETs conductive. When the number of transition bits is 3, the output transition bit number detecting circuit 61 outputs one-shot pulses as output signals 51, 52, 53, making corresponding FETs conductive. When the number of transition bits is 4, the output transition bit number detecting circuit 61 outputs one-shot pulses as all output signals 51, 52, 53, 54, making corresponding FETs conductive. The shift quantity of the inverted level of the input first stage increases depending on the number of FETs which are rendered conductive, for thereby preventing the input buffer circuit from operating in error due to power supply line noise.

In the second embodiment, the time of a second transition at which all other logic circuits than the input buffer circuit invert logic levels substantially simultaneously is detected from the time of a transition of an output signal from the sense amplifier, and also the operation threshold level of the input buffer circuit is variable depending on the number of transition bits. Therefore, the input buffer circuit maintains appropriate hysteresis characteristics depending on the magnitude of power supply line noise which is generated.

While 4-bit transitions have been described in the second embodiment, the number of transition bits is not limited to 4, but the input buffer circuit may be arranged to handle any arbitrary number of transition bits.

In the first and second embodiments, an output signal from the sense amplifier is detected to determine the control timing of the control circuit for controlling the logic threshold shift quantity. However, the control timing of the control circuit for controlling the logic threshold shift quantity may be determined in any of various other ways insofar as it controls the logic threshold shift quantity when noise generated on the power supply line of the input buffer circuit is maximum. Most of such noise is generated upon a transition in a circuit which operates with a relatively large current and a large amplitude, such as an output data buffer which shares the power supply with the input buffer circuit or an amplifier circuit for amplifying output data. Noise of a level large enough to cause the input buffer circuit to operate in error is not generated by a circuit which operates with a relatively small current and a small amplitude.

With the arrangement of the present invention, as described above, since the input buffer circuit operates as a hysteresis circuit in a final output transition time at which power supply line noise is most likely to occur, the input buffer circuit can operate stably without erroneous operation.

It is to be understood that variations and modifications of the input buffer circuit disclosed herein will be evident to those skilled in the art. It is intended that all such modifications and variations be included within the scope of the appended claims.

What is claimed is:

1. An input buffer circuit comprising:

a first inverter for receiving an input signal;

a second inverter for receiving an output signal from said first inverter;

transition time detecting means for detecting a transition time of a final output signal and outputting a control signal for a delay depending on a detected level of the transition time;

logic threshold control means for feeding the control signal from said transition time detecting means back to an input terminal of said second inverter to control a hysteresis interval of a logic threshold level of an output signal produced in response to said input signal; and a delay circuit for delaying an output signal from said second inverter and inputting the delayed output signal to said logic threshold control means.

2. An input buffer circuit according to claim 1, wherein said transition time detecting means comprises a plurality of transition time detecting means for detecting a transition time of a final output signal with a plurality of transition bits and outputting a plurality of respective control signals, and said logic threshold control means comprises means for varying the hysteresis interval of the logic threshold level of the output signal produced in response to said input signal, with said control signals outputted by said transition time detecting means.

3. An input buffer circuit comprising:

a CMOS inverter comprising P-channel and N-channel FETs having respective gates for receiving an input signal;

logic threshold control means comprising first and second P-channel FETs and first and second N-channel FETs which are connected in series to a power supply terminal shared by said CMOS inverter;

a first-stage output terminal connected commonly to a junction between said P-channel and N-channel FETs of the CMOS inverter and a junction between the second P-channel and N-channel FETs of said logic threshold control means;

a second inverter for inverting a signal inputted from said first-stage output terminal and outputting the inverted signal;

a pair of delay circuits for delaying a signal inputted from said second inverter and outputting the delayed signal to gates of the second P-channel and N-channel FETs of said logic threshold control means;

transition time detecting means for detecting a transition time of a final output signal and feeding a control signal for a delay depending on a detected level of the transition time back to a gate of the first P-channel FET of said logic threshold control means; and a third inverter for inverting an output signal from said transition time detecting means and outputting the inverted output signal to a gate of the first N-channel FET of said logic threshold control means.

4. An input buffer circuit according to claim 3, wherein said logic threshold control means comprises a plurality of pairs of FETs connected parallel to each other, said FETs in each pair comprising said first P-channel FET and said first N-channel FET, and said transition time detecting means comprises means for detecting a transition time of a final output signal with a plurality of transition bits and outputting a detected signal with a predetermined delay time, said input buffer circuit further comprising a transition bit number detecting circuit for energizing the first FETs of said logic threshold control means depending on the number of transition bits represented by the detected signal outputted from said transition time detecting means.

5. A method of controlling a logic threshold of an input buffer circuit comprising the steps of:

receiving an input signal into an input terminal of said input buffer circuit;

providing an intermediate signal from an output terminal of said input buffer circuit to a final circuit electrically connected to said input buffer circuit and functionally independent from said input buffer circuit;

detecting a transition time of a final output signal output from said final circuit; and controlling a hysteresis interval of a logic threshold level according to the transition time of said final output signal;

adjusting a delay depending on the transition time of said final output signal to bring a time to control the hysteresis interval of the logic threshold level into agreement with a time at which noise generated on a power supply line is maximum; and wherein said detecting step includes detecting the transition time of the final output signal with a plurality of transition bits in the final signal output stage, and said adjusting step includes adjusting a delay of the detected transition time depending on the number of transition bits such that the hysteresis interval of the logic threshold level is greater as the number of transition bits is longer.

* * * * *